US012654986B2

(12) United States Patent
Li et al.

(10) Patent No.: US 12,654,986 B2
(45) Date of Patent: Jun. 16, 2026

(54) FAULT DETECTION METHOD AND DEVICE FOR ELEVATOR POWER EQUIPMENT AND ELEVATOR SYSTEM

(71) Applicant: Otis Elevator Company, Farmington, CT (US)

(72) Inventors: Guosong Li, Tianjin (CN); James Leo Hubbard, III, Farmington, CT (US)

(73) Assignee: OTIS ELEVATOR COMPANY, Farmington, CT (US)

( * ) Notice: Subject to any disclaimer, the term of this patent is extended or adjusted under 35 U.S.C. 154(b) by 918 days.

(21) Appl. No.: 17/964,591

(22) Filed: Oct. 12, 2022

(65) Prior Publication Data

US 2023/0286777 A1 Sep. 14, 2023

(30) Foreign Application Priority Data

Mar. 8, 2022 (CN) .......................... 202210218783.5

(51) Int. Cl.
*B66B 5/00* (2006.01)
*B66B 1/28* (2006.01)
(Continued)

(52) U.S. Cl.
CPC .............. *B66B 5/0031* (2013.01); *B66B 1/28* (2013.01); *B66B 5/0037* (2013.01); *B66B 5/02* (2013.01); *G01R 23/16* (2013.01)

(58) Field of Classification Search
CPC . B66B 1/24; B66B 1/28–3423; B66B 1/3446; B66B 1/3453; B66B 5/00;
(Continued)

(56) References Cited

U.S. PATENT DOCUMENTS 11,506,569 B2 * 11/2022 Hayzen ............... G01M 13/045
12,135,543 B2 * 11/2024 Gabaldon ............ G08B 21/187
(Continued)

FOREIGN PATENT DOCUMENTS

EP 1548419 A1 6/2005
EP 2543977 A1 6/2005

OTHER PUBLICATIONS

European Search Report for Application No. 22216436.0, Issued Jul. 10, 2023,6 Pages.

*Primary Examiner* — Christopher Uhlir
(74) *Attorney, Agent, or Firm* — CANTOR COLBURN LLP

(57) ABSTRACT

A fault detection method and device for elevator power equipment and an elevator system. The method includes acquiring running speed data of an actuator in the elevator power equipment, and using the corresponding running speed data when the elevator is at a first speed and within a preset duration as target data; obtaining time-domain signal data of acceleration by calculation according to the target data, obtaining frequency-domain signal data of acceleration by conversion according to the time-domain signal data; comparing peak frequencies that form waveform peaks in the frequency-domain signal data with characteristic frequencies of the elevator power equipment, and determining the elevator power equipment to be faulty when at least one first frequency is detected in the peak frequencies, wherein the first frequency matches one of the characteristic frequencies and the amplitude thereof exceeds a preset threshold.

19 Claims, 4 Drawing Sheets

(51) Int. Cl.
  *B66B 5/02*    (2006.01)
  *G01R 23/16*   (2006.01)

(58) Field of Classification Search
  CPC ... B66B 5/0006; B66B 5/0018; B66B 5/0031;
      B66B 5/0037; B66B 5/02; B66B 5/04;
      B66B 5/06; G01R 23/00; G01R 23/02;
      G01R 23/16
  See application file for complete search history.

(56)           References Cited

U.S. PATENT DOCUMENTS

| | | | |
|---|---|---|---|
| 12,429,523 B2* | 9/2025 | Miyauchi | G01R 23/16 |
| 2010/0094798 A1* | 4/2010 | Shudo | G06V 20/52 |
| | | | 706/54 |
| 2019/0337759 A1* | 11/2019 | Dube | B66B 1/30 |
| 2024/0159623 A1* | 5/2024 | Mutoh | G01M 13/045 |

* cited by examiner

| Characteristic Frequency Description | Frequency Value (Hz) | | | | | | | | | |
|---|---|---|---|---|---|---|---|---|---|---|
| | 1x | 2x | 3x | 4x | 5x | 6x | 7x | 8x | 9x | 10x |
| Motor Mechanical Rotation Frequency | 13.50 | 27.00 | 40.50 | 54.00 | 67.50 | 81.00 | 94.50 | 108.00 | 121.50 | 135.00 |
| Bearing Rolling Element Frequency – Brake Side | 22.59 | 45.18 | 67.77 | 90.37 | 112.96 | 135.55 | 158.14 | 180.73 | 203.32 | 225.92 |
| Bearing Rolling Element Frequency – Stator Side | 29.02 | 58.05 | 87.07 | 116.09 | 145.12 | 174.14 | 203.16 | 232.19 | 261.21 | 290.23 |
| Bearing Outer Ring Fault Characteristic Frequency-Brake Side | 33.73 | 67.46 | 101.18 | 134.91 | 168.64 | 202.37 | 236.10 | 269.83 | 303.55 | 337.28 |
| Bearing Outer Ring Fault Characteristic Frequency-Stator Side | 44.64 | 89.28 | 133.92 | 178.56 | 223.20 | 267.84 | 312.47 | 357.11 | 401.75 | 446.39 |
| Motor Electrical Frequency | 94.50 | 189.00 | 283.50 | 378.00 | 472.50 | 567.00 | 661.50 | 756.00 | 850.50 | 945.00 |
| Bearing Rolling Element Fault Characteristic Frequency-Brake Side | 45.18 | 90.37 | 135.55 | 180.73 | 225.92 | 271.10 | 316.28 | 361.46 | 406.65 | 451.83 |
| Bearing Rolling Element Fault Characteristic Frequency-Stator Side | 58.05 | 116.09 | 174.14 | 232.19 | 290.23 | 348.28 | 406.33 | 464.37 | 522.42 | 580.47 |
| Bearing Inner Ring Fault Characteristic Frequency-Brake Side | 53.33 | 106.66 | 159.99 | 213.32 | 266.65 | 319.99 | 373.32 | 426.65 | 479.98 | 533.31 |
| Bearing Inner Ring Fault Characteristic Frequency-Stator Side | 64.18 | 128.37 | 192.55 | 256.74 | 320.92 | 385.11 | 449.29 | 513.48 | 577.66 | 641.85 |
| Motor Pole Frequency | 189.00 | 378.00 | 567.00 | 756.00 | 945.00 | 1134.00 | 1323.00 | 1512.00 | 1701.00 | 1890.00 |
| Motor Stator Slot Frequency | 486.00 | 972.00 | 1458.00 | 1944.00 | 2430.00 | 2916.00 | 3402.00 | 3888.00 | 4374.00 | 4860.00 |

FIG. 6

FAULT DETECTION METHOD AND DEVICE FOR ELEVATOR POWER EQUIPMENT AND ELEVATOR SYSTEM

FOREIGN PRIORITY

This application claims priority to Chinese Patent Application No. 202210218783.5, filed Mar. 8, 2022, and all the benefits accruing therefrom under 35 U.S.C. § 119, the contents of which in its entirety are herein incorporated by reference.

TECHNICAL FIELD

The present disclosure relates to the technical field of elevators, in particular to a fault detection method for elevator power equipment, a fault detection device for elevator power equipment, and an elevator system.

BACKGROUND

In an elevator system, equipment such as a traction machine is usually provided to provide driving force for elevator operation. The operation status of such elevator power equipment will not only affect the normal and safe operation of the elevator, but may also related with the personal safety of passengers and equipment damage.

At present, bearing issues in elevator power equipment have received much attention, and there are already technologies for diagnosing and monitoring bearing performance. For example, one or more vibration sensors may be specially configured in the equipment to monitor the working performance conditions of the bearings online, so as to timely predict the possible failure and damage of the bearings and other unfavorable situations, thereby ensuring the safe operation of the power equipment and the elevator system.

SUMMARY

In view of the foregoing, the present disclosure provides a fault detection method for elevator power equipment, a fault detection device for elevator power equipment, and an elevator system, so as to solve or at least alleviate one or more of the aforementioned problems and other problems in the prior art.

First, according to an aspect of the present disclosure, a fault detection method for elevator power equipment is provided, which comprises the steps of:

acquiring running speed data of an actuator in the elevator power equipment, and using the corresponding running speed data when the elevator is at a first speed and within a preset time period as target data;

obtaining by calculation time-domain signal data of the acceleration according to the target data;

obtaining by conversion frequency-domain signal data of the acceleration according to the time-domain signal data; and comparing peak frequencies that form waveform peaks in the frequency-domain signal data with characteristic frequencies of the elevator power equipment, and determining the elevator power equipment to be faulty when at least one first frequency is detected in the peak frequencies, wherein the first frequency matches one of the characteristic frequencies and the amplitude thereof exceeds a preset threshold.

The fault detection method for elevator power equipment according to the present disclosure, optionally, further comprises the steps of: acquiring the corresponding running speed data of the actuator when the elevator is at a second speed and within the preset time period as target data when the first frequency is detected in the peak frequencies, wherein the second speed is different from the first speed; obtaining time-domain signal data of acceleration by calculation according to the target data acquired; obtaining frequency-domain signal data of acceleration by conversion according to the time-domain signal data obtained; and comparing the peak frequencies that form waveform peaks in the frequency-domain signal data obtained with the first frequency, and determining the elevator power equipment to be faulty when a second frequency is detected in the peak frequencies, wherein the frequencies of the second frequency and the first frequency are the same, and the ratio between the amplitudes of the second frequency and the first frequency is equal to the ratio of the second speed to the first speed.

In the fault detection method for elevator power equipment according to the present disclosure, optionally, the second speed is smaller than the first speed, and/or the range of the preset duration is 1 to 60 seconds.

In the fault detection method for elevator power equipment according to the present disclosure, optionally, the running speed data of the actuator is acquired through an encoder associated with the actuator.

In the fault detection method for elevator power equipment according to the present disclosure, optionally, the sampling frequency of the encoder is set to be at least twice the characteristic frequency, and the recording duration of the encoder is set to be at least twice the reciprocal of the characteristic frequency.

In the fault detection method for elevator power equipment according to the present disclosure, optionally, the time-domain signal data is obtained by performing differential calculation according to the target data, and/or the frequency-domain signal data is obtained by performing Fast Fourier Transform according to the time-domain signal data.

The fault detection method for elevator power equipment according to the present disclosure, optionally, further comprises the step of: outputting report information and/or controlling the elevator to stop running after it is determined that the elevator power equipment is faulty.

In the fault detection method for elevator power equipment according to the present disclosure, optionally, the report information is transmitted to the local management system of the elevator, the cloud server and/or the user terminal, wherein the user terminal comprises the user's mobile communication terminal.

In the fault detection method for elevator power equipment according to the present disclosure, optionally, the actuator comprises a motor, and the characteristic frequencies comprise the natural frequency of the bearing rolling element, the fault characteristic frequency of the bearing rolling element, the fault characteristic frequency of the bearing outer ring and the fault characteristic frequency of the bearing inner ring on the stator side in the motor, the natural frequency of the bearing rolling element, the fault characteristic frequency of the bearing rolling element, the fault characteristic frequency of the bearing outer ring and the fault characteristic frequency of the bearing inner ring on the brake side of the elevator, the natural mechanical rotation frequency of the motor, the electrical frequency, the motor pole frequency and the motor stator slot frequency.

In addition, according to another aspect of the present disclosure, a fault detection device for elevator power equipment is further provided, which comprises a processor configured to perform the steps of: acquiring the running speed data of an actuator in the elevator power equipment, and using the corresponding running speed data when the elevator is at a first speed and within a preset duration as target data; obtaining time-domain signal data of acceleration by calculation according to the target data; obtaining frequency-domain signal data of acceleration by conversion according to the time-domain signal data; and comparing the peak frequencies that form waveform peaks in the frequency-domain signal data with the characteristic frequencies of the elevator power equipment, and determining the elevator power equipment to be faulty when at least one first frequency is detected in the peak frequencies, wherein the first frequency matches one of the characteristic frequencies and the amplitude thereof exceeds a preset threshold.

In the fault detection device for elevator power equipment according to the present disclosure, optionally, the processor is further configured to perform the steps of: acquiring the corresponding running speed data of the actuator when the elevator is at a second speed and within the preset duration as the target data when the first frequency is detected in the peak frequencies, wherein the second speed is different from the first speed; obtaining time-domain signal data of acceleration by calculation according to the target data acquired; obtaining frequency-domain signal data of acceleration by conversion according to the time-domain signal data obtained; and comparing the peak frequencies that form waveform peaks in the frequency-domain signal data obtained with the first frequency, and determining the elevator power equipment to be faulty when a second frequency is detected in the peak frequencies, wherein the frequencies of the second frequency and the first frequency are the same, and the ratio between the amplitudes of the second frequency and the first frequency is equal to the ratio of the second speed to the first speed.

In the fault detection device for elevator power equipment according to the present disclosure, optionally, the second speed is lower than the first speed, and/or the range of the preset duration is 1 to 60 seconds.

In the fault detection device for elevator power equipment according to the present disclosure, optionally, the processor is arranged in an encoder associated with the actuator, or is arranged in a device connected with the encoder and/or the elevator controller and obtaining the running speed data of the actuator and/or the running speed data of the elevator from the encoder and/or the elevator controller.

In the fault detection device for elevator power equipment according to the present disclosure, optionally, the sampling frequency of the encoder is set to be at least twice the characteristic frequency, and the recording duration of the encoder is set to be at least twice the reciprocal of the characteristic frequency.

In the fault detection device for elevator power equipment according to the present disclosure, optionally, the processor is configured to: perform differential calculation according to the target data to obtain the time-domain signal data, and/or to perform Fast Fourier Transform according to the time-domain signal data to obtain the frequency-domain signal data.

In the fault detection device for elevator power equipment according to the present disclosure, optionally, the processor is further configured to: output report information and/or control the elevator to stop running after it is determined that the elevator power equipment is faulty.

In the fault detection device for elevator power equipment according to the present disclosure, optionally, the report information is transmitted to the local management system of the elevator, the cloud server and/or the user terminal, wherein the user terminal comprises the user's mobile communication terminal.

In the fault detection device for elevator power equipment according to the present disclosure, optionally, the actuator comprises a motor, and the characteristic frequencies comprise the natural frequency of the bearing rolling element, the fault characteristic frequency of the bearing rolling element, the fault characteristic frequency of the bearing outer ring and the fault characteristic frequency of the bearing inner ring on the stator side in the motor, the natural frequency of the bearing rolling element, the fault characteristic frequency of the bearing rolling element, the fault characteristic frequency of the bearing outer ring and the fault characteristic frequency of the bearing inner ring on the brake side of elevator, the natural mechanical rotation frequency of the motor, the electrical frequency, the motor pole frequency and the motor stator slot frequency.

In addition, according to yet another aspect of the present disclosure, an elevator system is further provided, which comprises the fault detection device for elevator power equipment according to any of the above.

From the following detailed description combined with the accompanying drawings, the principles, features, characteristics and advantages of the technical solutions according to the present disclosure will be clearly understood. For example, the present disclosure innovatively proposes a "sensor-less" technical solution, that is, by fully excavating and utilizing the original configuration in the elevator system, online fault detection of elevator power equipment can be carried out in a timely, reliable and accurate manner, which can effectively reduce on-site maintenance costs and improve working efficiency. Its low application cost, wide application range and automatic operation are very conducive to ensuring the safe operation of elevators, while reducing operation and maintenance costs, and enhancing the practicability and competitiveness of elevator products.

BRIEF DESCRIPTION OF THE DRAWINGS

The technical solutions of the present disclosure will be described in further detail below with reference to the accompanying drawings and embodiments. However, it should be understood that these drawings are designed merely for the purpose of explanation and only intended to conceptually illustrate the structural configurations described herein, and are not required to be drawn to scale.

FIG. 6 is a characteristic frequency table of an embodiment of an elevator power equipment.

DETAILED DESCRIPTION

First, it should be noted that the steps, components, characteristics, advantages and the like of the fault detection method for elevator power equipment, the elevator power equipment fault detection device and the elevator system according to the present disclosure will be described below by way of example. However, neither of the descriptions should be understood as limiting the present disclosure in any way. In the text, the technical terms "first" and "second" are only used for the purpose of distinguishing and are not intended to indicate the order and relative importance thereof, and the technical term "substantially" is intended to comprise the insubstantial difference associated with a specific quantity, for example, may comprise the ranges of ±8%, ±5%, or ±2% of a given value.

In addition, for any single technical feature described or implied in the embodiments mentioned herein or any single technical feature shown or implied in individual drawings, the present disclosure still allows for any combination or deletion of these technical features (or equivalents thereof) without any technical obstacle. Therefore, it should be considered that these more embodiments according to the present disclosure are also within the scope recorded in this document. In addition, for the sake of brevity, general items commonly known to those skilled in the art, such as the basic configurations and working principles of the elevator power equipment, motors, encoders, frequency converters, etc., will not be described in greater detail herein.

Figure 1:
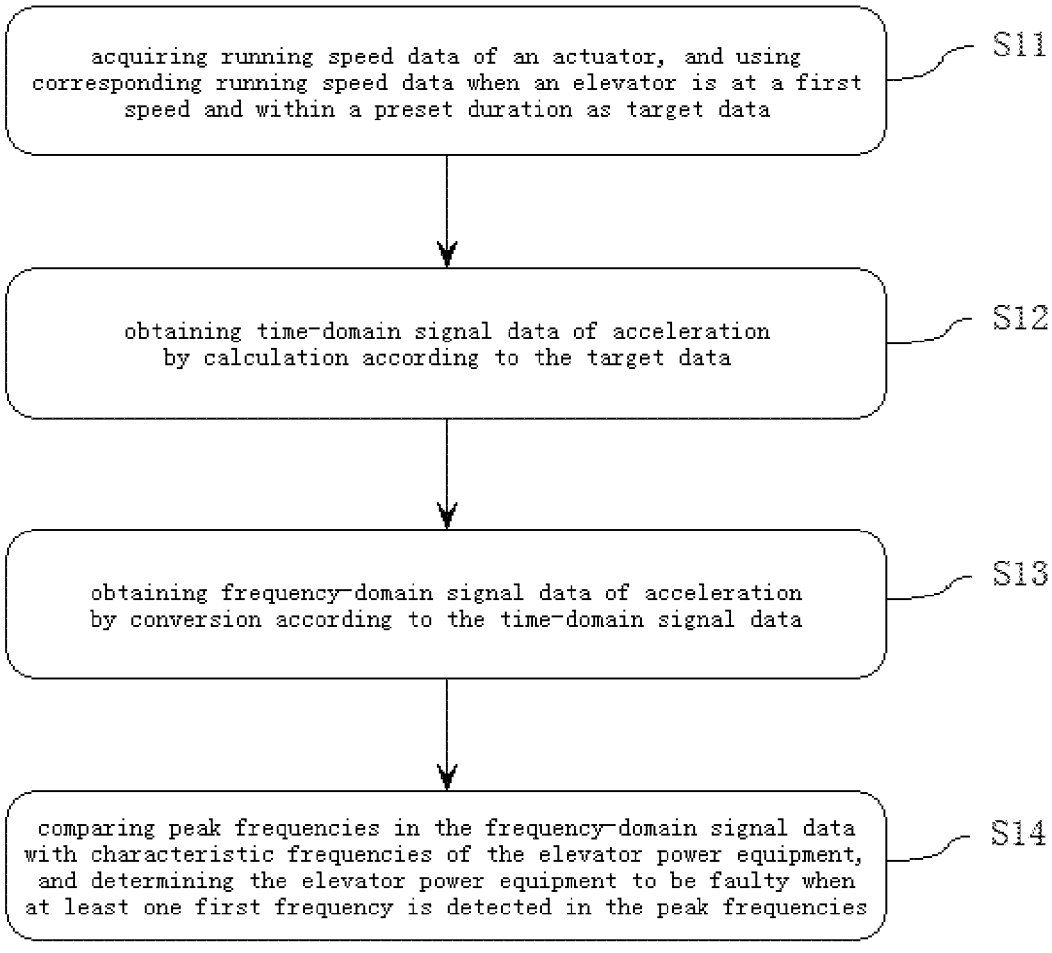
FIG. 1 is a schematic flowchart of an embodiment of a fault detection method for elevator power equipment according to the present disclosure.

FIG. 1 first shows a schematic flowchart of an embodiment of a fault detection method for elevator power equipment according to the present disclosure. At the same time, FIGS. 2-5 exemplarily show the schematic diagrams of signal data corresponding to the steps in the embodiment in FIG. 1, respectively. The fault detection method for elevator power equipment according to the present disclosure will be introduced below by way of example only with reference to the above drawings.

As shown in FIG. 1, in the embodiment of the method according to the present disclosure, the following steps may be included:

In step S11, the running speed data of the elevator power equipment configured in the elevator system may be obtained, that is, the running speed data of the actuator (such as traction machines, etc.) in the elevator power equipment used to provide power to the elevator system. Since electric energy (e.g., grid power, batteries, etc.) have been very conveniently and widely used in modern society, such actuators are usually in the form of motors, which will be exemplified herein. It should be understood that, in some cases, the actuators may also be in other forms of power equipment powered by power sources such as fuel, hydrogen, and the like.

There are various ways to obtain the running speed data of the actuator, for example, it may be acquired directly through an encoder associated with the actuator very conveniently. Such encoders are commercially available in the market and have been widely used in the existing elevator systems. They are usually installed and arranged on the motor drive shaft. The acquired signals are transmitted to the control section in the elevator system, so the above running speed data can also be obtained from the control section. Of course, although not being absolutely necessary in the method of the present disclosure, in some application scenarios, however, one or more optional sensors may also be allowed to be arranged to specifically collect the running speed data of the actuator.

Figure 2:
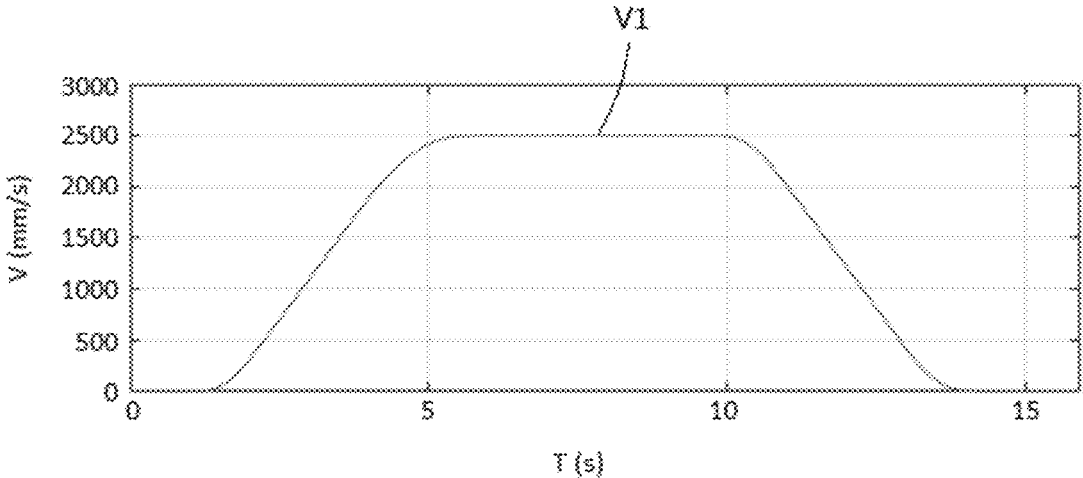
FIGS. 2-5 respectively show schematic diagrams of signal data corresponding to the steps in the embodiment of the fault detection method for elevator power equipment shown in FIG. 1
Figure 3:
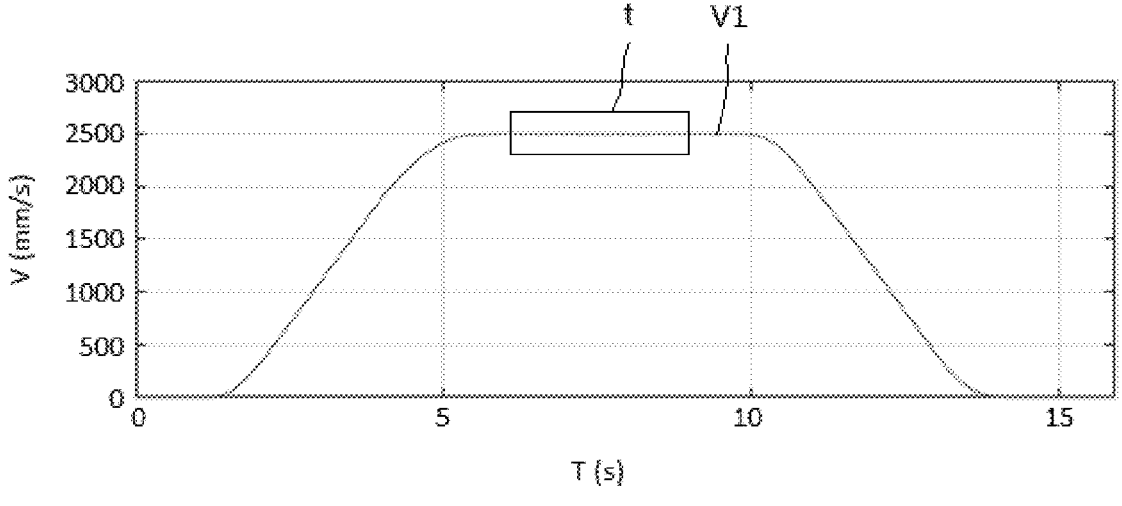

Referring to FIGS. 2 and 3, when the elevator system receives a request to take the elevator, under the action of the driving force output by the actuator of the elevator power equipment, the elevator (usually refers to the elevator car herein) will start from a static state and move towards the destination, and deliver the carried people or items to the requested destination. Then, the elevator stops running and waits for the next run. The above process is clearly shown by the elevator speed curves in FIGS. 2 and 3. It should be understood that during the operation of the elevator from start to stop, there may be one or more periods during which the elevator is operated at a substantially constant speed. The aforementioned substantially constant elevator running speed is indicated schematically with reference numeral V1 in FIGS. 2 and 3.

In step S11, among the collected running speed data of the actuator, the corresponding part of the running speed data when the elevator is at speed V1 and within the preset duration may then be selected as the target data to be analyzed and processed later, that is, the duration of this part of the running speed data is consistent with the aforementioned constant speed running period during the elevator operation. The aforementioned preset duration is schematically indicated by the time period t in FIG. 3, while the specific selected value can be flexibly set according to the actual situation, for example, it can be selected from 1 to 60 seconds or any other suitable range.

Figure 4:
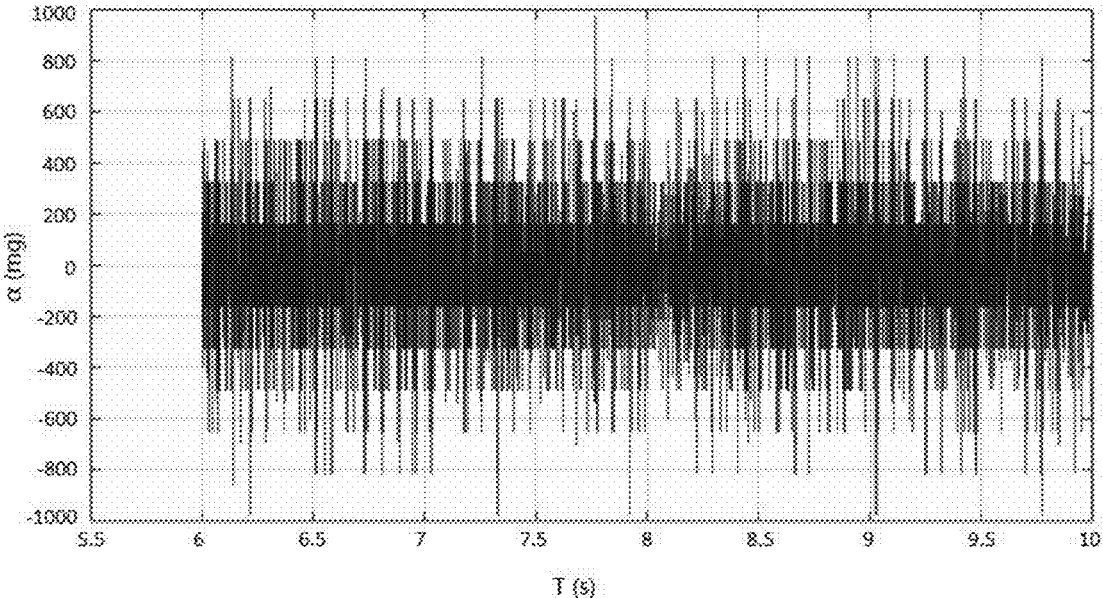
Figure 5:
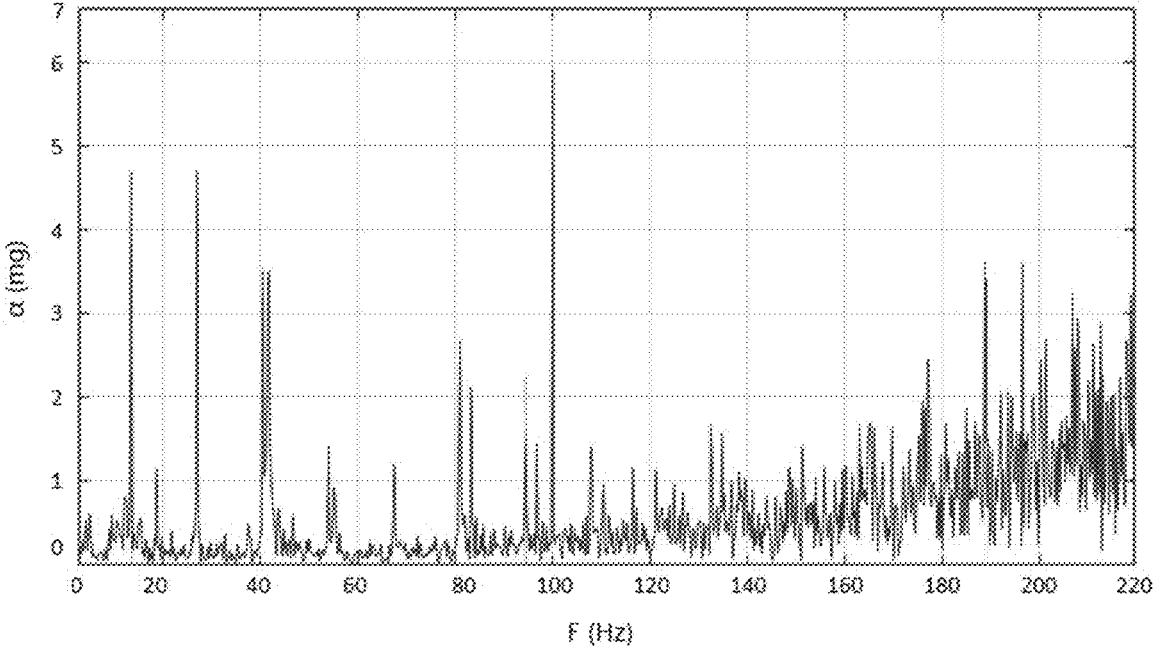

With continued reference to FIG. 1, in step S12, the target data obtained in step S11 can be calculated and processed, so as to obtain the time-domain signal data of the acceleration. Referring to FIG. 4, such time-domain signal data obtained through processing is schematically indicated. The ordinate in the figure represents the acceleration a (the unit is mg, i.e., a thousandth of the gravitational acceleration g), which reflects the operation fluctuation of the elevator power equipment in the corresponding time period t, and this fluctuation information contains the current working performance features of the elevator power equipment. Therefore, by further analyzing and processing the fluctuation information, the defects, faults, etc. possibly existing in the elevator power equipment may be evaluated and discovered. Usually, the differential calculation method may be used directly to process the target data. Of course, in some optional situations, it is also allowed to use a more complex or accurate calculation method to process the aforementioned time-domain signal data, which can be found from many existing technical solutions for obtaining acceleration from velocity calculation. It is not discussed herein.

Next, in step S13, the frequency-domain signal data of the acceleration can be obtained by performing conversion processing according to the time-domain signal data. Accordingly, with reference to FIG. 4, the frequency-domain signal data obtained after using Fast Fourier Transform (FFT) data for conversion processing for the time-domain signals in FIG. 3 is shown by way of example, wherein the abscissa represents the frequency F (the unit is Hz), and the ordinate represents the acceleration a (the unit is mg). As shown in FIG. 4, some peak frequencies can be found in the frequency-domain signal data in the figure, that is, they form a waveform peak shape relative to other adjacent frequencies on both sides (i.e., there is a relatively obvious difference in the value of the acceleration a). The peak frequencies can be easily identified through numerical comparison, and the prior art has provided many such identification solutions, which can be applied to the solution of the present disclosure if necessary. In addition, it can be understood that by selecting to set different numerical ranges for the above difference, different identification precisions for the peak frequencies can be obtained, which can be set according to the requirements of specific applications.

As an optional situation, in step S13, other alternative transformation processing forms, such as Discrete Fourier Transform (DFT), etc. may be used; or, before the transformation processing is performed, filter processing may be further performed on the time-domain signal data to improve the processing precision and efficiency, etc. The filter processing solutions provided in the prior art can be applied to the solutions of the present disclosure, which will not be described in greater detail here.

The inventor pointed out that although existing equipment such as encoders have been commonly used in elevator systems for a long time, people in the industry are always accustomed to using such existing equipment to obtain speed data, so they have not considered making full use of them. In particular, they have not considered using them to analyze the working performance and failures of elevator power equipment. The proposal of the solution of the present disclosure changes the inherent understanding of the prior art in the above aspects, and especially breaks through the limitations of previous understanding. More specifically, the present disclosure proposes to further obtain signal data related to acceleration based on the running speed data of the actuator, and by analyzing and processing the signal data related to acceleration, problems such as possible defects and faults that may exist in the elevator power equipment can be detected. An exemplary description will be given in conjunction with step S14.

In step S14 of FIG. 1, the peak frequencies obtained as described above (FIG. 5) can be compared with the characteristic frequencies of the elevator power equipment (FIG. 6). Once it is detected that there is at least one frequency f1 that matches the frequency of the characteristic frequencies in the aforementioned peak frequencies, which exceeds the preset amplitude, it can be determined that the elevator power equipment is faulty. For example, some components such as bearing rolling elements, bearing inner and outer rings, and motor stator slots that may be arranged in the elevator power equipment may already have defects such as wear, cracks, improper assembly location, etc. It should be understood that "match" in this text refers to the situation that the value is the same or substantially the same. In addition, regarding the specific setting of the corresponding threshold of the aforementioned amplitude, it can be selected to be set into different numerical values based on different practical application requirements accordingly. The present disclosure does not make any limitation to this.

For different elevator power equipment (e.g., configured with actuators with different rated powers respectively), they have their natural characteristic frequencies, respectively. For example, in the case where a motor is used as the actuator in the elevator power equipment, the characteristic frequencies may comprise, but are not limited to, the natural frequency of the bearing rolling element, the fault characteristic frequency of the bearing rolling element, the fault characteristic frequency of the bearing outer ring and the fault characteristic frequency of the bearing inner ring on the stator side in the motor; the natural frequency of the bearing rolling element, the fault characteristic frequency of the bearing rolling element, the fault characteristic frequency of the bearing outer ring and the fault characteristic frequency of the bearing inner ring on the brake side of the elevator in the motor; the natural mechanical rotation frequency of the motor (Round per Second); the natural electrical frequency of the motor, the natural motor pole frequency of the motor; the natural motor stator slot frequency of the motor, etc. The specific characteristic frequency values of the respective parts of the elevator power equipment can be obtained from equipment manufacturers, R&D institutions, etc., or can also be obtained through experimental tests, evaluation calculations, and many other means.

For easy understanding, the characteristic frequencies for an illustrative purpose listed above are all exemplarily shown in FIG. 6 by some corresponding characteristic frequency values of a specific example of an elevator power equipment. By way of illustration, with reference to FIGS. 5 and 6 in conjunction, for the peak frequency of approximately 188.89 Hz exemplified in FIG. 5, it also happens to appear at the motor pole frequency of 189.00 Hz in FIG. 6. When the above two values match with each other and the corresponding amplitude 3.66 mg of the peak frequency at this time has exceeded the preset threshold (e.g., it may be set to 3 mg in some embodiments, or to 3.5 mg in other embodiments, etc.), it can thus be determined that the motor in the elevator power equipment may have defects or failures at this time, so that the performance problems in the elevator power equipment can be discovered and solved in time, thereby ensuring the stable and reliable operation of the elevator system.

In addition, it should be pointed out that the characteristic frequencies of the elevator power equipment should be understood as not only comprising the fundamental frequency of each involved frequency, but also comprising the frequency multiplication based on the fundamental frequency (such as twice the fundamental frequency, 3 times the fundamental frequency, etc., where the selection of specific frequency multiplication can be set as required, for example, in practice, up to 6 times the fundamental frequency can be considered) and any possible combination between these fundamental frequencies or frequency multiplication. In FIG. 6, the fundamental frequencies and their respective 2 to 10 times frequency multiplications of these exemplary characteristic frequencies, etc. are also shown in a list. The different fundamental frequencies, frequency multiplications and their possible superimposed combinations of these different parts together form the characteristic frequencies of the elevator power equipment. For example, with reference to FIG. 6 for exemplary illustration, if a peak frequency of approximately 142 Hz is found in the aforementioned frequency-domain signal data, and the corresponding amplitude of the peak frequency at this time, 5.86 mg, has exceeded a preset threshold (e.g., may be set to 5 mg in some embodiments, or to 5.5 mg in other embodiments, etc.), since it matches the sum of the two numerical values of 128.37 Hz (twice the frequency of the fault characteristic frequency of the bearing inner ring on the stator side) and 13.5 Hz (the fundamental frequency of the mechanical rotation frequency of the motor) listed in FIG. 6, so the above determination conditions are met, that is, it can be determined that the motor in the elevator power equipment may have defects or faults at this time.

It should be understood that the above embodiments are only exemplary description. Without departing from the spirit of the present disclosure, the method of the present disclosure allows more possible settings, changes and adjustments to be made according to different application requirements, to which there will be no restrictions at all.

For example, as an example, in some application scenarios, when a first frequency that matches one of the characteristic frequencies and whose amplitude exceeds a preset threshold is detected in the obtained peak frequencies in step S14, it is not necessary to immediately determine that the elevator power equipment is faulty (because there may be natural frequency interference, etc. in the process of data acquisition, analysis and processing), but to consider combining the following steps for analysis and determination to further improve the detection accuracy:

The running speed data of the actuator when the elevator is at the second speed V2 (different from the aforementioned speed V1) and within the same preset duration can be acquired as the target data. Then, the processing methods of steps S12 and S13 as described above can be used to process the above target data accordingly to obtain the corresponding frequency-domain signal data of the acceleration. And then, the peak frequencies that form the waveform peaks in the frequency-domain signal data are compared with the first frequency. Once a frequency f2 (f2 and f1 have the same frequency, and the amplitude ratio between them is equal to the ratio of V2 to V1) is detected in the peak frequencies, this shows that even under different speed conditions, the elevator power equipment still exhibits the corresponding running features accordingly. It can thus be determined that the elevator power equipment has some abnormal natural characteristics in performance, so some parts of the elevator power equipment have been faulty.

In actual detections, the elevator can be optionally controlled to run at a speed lower than the speed V1, that is, the speed V2 is lower than the speed V1 (e.g., the ratio of the two is 2/3, etc.). This method is conducive to performing a further detection to better determine if the elevator power equipment is faulty. However, as an alternative, a solution where the elevator is optionally controlled to run at a speed higher than the speed V1, i.e., the speed V2 is higher than the speed V1, is also feasible.

For further analysis, when the frequency f1 at the first speed V1 does not change with the second speed V2, it means that the frequency f1 is the natural frequency of a certain component in the elevator traction machine or the elevator system. This can also provide valuable guidance for the investigation and analysis of the problem.

For another example, in some application scenarios, the sampling frequency of the encoder can be adjusted and set based on the requirements of the detection accuracy of the elevator power equipment failure, for example, the pulse count PPR (Pulse Per Round) of the encoder can be increased. According to the solution of the present disclosure, the sampling frequency of the encoder can optionally be set to twice or more (such as 3 times or 4 times, etc.) the characteristic frequency of the elevator power equipment (e.g., the maximum value of the fundamental frequency of the characteristic frequency, or a certain target characteristic frequency of interest, etc.), and the recording time of the encoder is set to be at least twice the reciprocal of the above characteristic frequency, so that when the running speed data of the actuator is acquired by the encoder, it is beneficial that the frequency-domain signal data obtained after being processed by the solution of the present disclosure can basically cover the characteristic frequencies of the elevator power equipment. In other words, under the same circumstances, by increasing the sampling frequency of the encoder, the obtained frequency-domain signal data can cover a wider range of characteristic frequencies of the elevator power equipment, thereby widening the scope of application of the solution of the present disclosure and improving the detection accuracy. For example, when the sampling frequency of the encoder is increased from 1 kHz to 2 kHz, the sampling bandwidth can be doubled, thereby effectively widening the frequency detection range of elevator power equipment, and better diagnosing elevator power equipment failure problems.

For still another example, as an optional situation, when it is determined that the elevator power equipment is faulty, report information can be output in any suitable form such as text prompts, voice prompts, etc. For example, such report information can be transmitted to the local management system of the elevator, cloud server and/or user terminal (such as mobile phone, PAD and other mobile communication terminals), so that the relevant persons can be informed of the current situation of the elevator power equipment in time and take corresponding measures to ensure that the elevator system can run in a safe and reliable manner for a long time. In addition, in the case of failure of the elevator power equipment, if the elevator continues to run, it may bring risks to the safety of the elevator. Therefore, at this time, various safety measures can be considered to be used individually or in combination, for example, the elevator can be controlled to stop running, and the report information can be transmitted to the user terminal, etc., so as to achieve the purpose of safety precaution and timely warning.

As another aspect that is significantly superior to the prior art, the present disclosure also provides a fault detection device for elevator power equipment, which is provided with a processor for executing, for example, the corresponding steps of the method according to the present disclosure as discussed above. The fault detection device for elevator power equipment can be manufactured and sold separately.

It can be understood that according to the disclosure of the present application, those skilled in the art may use, for example, processors, electronic circuits, integrated circuits (ASICs) and/or memories and combinational logic circuits for executing one or more software or firmware programs, and any other suitable element and component to realize the aforementioned processor in the fault detection device for elevator power equipment. In addition, since the technical contents such as acquisition, calculation or conversion processing of the running speed data, detection, analysis and determination, characteristic frequency, output of report information, control of the elevator to stop running, etc., have been described in great detail in the above, reference may be directly made to the specific description of the corresponding parts mentioned above to realize the configuration of the aforementioned processor, which will not be repeated herein.

It should be understood that the above processor can not only be directly arranged in the encoder associated with the actuator, but can also can be arranged in the devices connected with the encoder and/or the elevator controller. These devices may comprise but are not limited to, for example, frequency converters, gateways and other devices, which can obtain the aforementioned running speed data of the actuator and/or the running speed data of the elevator from the aforementioned encoder and/or the elevator controller in the elevator system through a network connection. Furthermore, the characteristic frequency data of the elevator power equipment can be stored in any suitable device in the elevator system, such as encoders, frequency converters, gateways, etc., as required by the application.

According to the technical solutions of the present disclosure, an elevator system is further provided. Specifically, the elevator system may be equipped with the fault detection device for elevator power equipment designed and provided according to the present disclosure, so that the current working performance of the elevator power equipment can be detected in an automatic, convenient, efficient and accurate manner. In particular, it is not necessary to add additional devices such as sensors, as in the prior art, to perform equipment diagnosis, which saves costs, reduces on-site maintenance costs, and improves detection efficiency and accuracy, thereby achieving the significant technical advantages as mentioned above.

The fault detection method for elevator power equipment, the fault detection device for elevator power equipment and the elevator system according to the invention have been described above in detail by way of example only. These examples are merely used to illustrate the principles and embodiments of the present disclosure, rather than limiting the present disclosure. Various modifications and improvements can be made by those skilled in the art without departing from the spirit and scope of the present disclosure. Therefore, all equivalent technical solutions should fall within the scope of the present disclosure and be defined by the claims of the present disclosure.

What is claimed is:

1. A fault detection method for elevator power equipment, comprising steps of:

acquiring running speed data of an actuator in the elevator power equipment, and using corresponding running speed data in response to an elevator is at a first speed and within a preset duration as target data;

obtaining time-domain signal data of acceleration by calculation according to the target data;

obtaining frequency-domain signal data of acceleration by conversion according to the time-domain signal data; and comparing peak frequencies that form waveform peaks in the frequency-domain signal data with characteristic frequencies of the elevator power equipment, and determining the elevator power equipment to be faulty in response to at least one first frequency is detected in the peak frequencies, wherein the at least one first frequency matches one of the characteristic frequencies and an amplitude thereof exceeds a preset threshold.

2. The fault detection method for elevator power equipment according to claim 1, further comprising steps of:

acquiring corresponding running speed data of the actuator in response to the elevator is at a second speed and within the preset duration as target data in response to the at least one first frequency is detected in the peak frequencies, wherein the second speed is different from the first speed;

obtaining time-domain signal data of acceleration by calculation according to the target data acquired;

obtaining frequency-domain signal data of acceleration by conversion according to the time-domain signal data obtained; and comparing peak frequencies that form waveform peaks in the frequency-domain signal data obtained with the at least one first frequency, and determining the elevator power equipment to be faulty in response to a second frequency is detected in the peak frequencies, wherein frequencies of the second frequency and the at least one first frequency are the same, and a ratio between amplitudes of the second frequency and the at least one first frequency is equal to a ratio of the second speed to the first speed.

3. The fault detection method for elevator power equipment according to claim 2, wherein the second speed is lower than the first speed, and/or a range of the preset duration is 1 to 60 seconds.

4. The fault detection method for elevator power equipment according to claim 1, wherein the running speed data of the actuator is acquired through an encoder associated with the actuator.

5. The fault detection method for elevator power equipment according to claim 4, wherein a sampling frequency of the encoder is set to be at least twice a characteristic frequency, and a recording duration of the encoder is set to be at least twice the reciprocal of the characteristic frequency.

6. The fault detection method for elevator power equipment according to claim 1, wherein the time-domain signal data is obtained by performing differential calculation according to the target data, and/or the frequency-domain signal data is obtained by performing Fast Fourier Transform according to the time-domain signal data.

7. The fault detection method for elevator power equipment according to claim 1, further comprising the step of: outputting report information and/or controlling the elevator to stop running after it is determined that the elevator power equipment is faulty.

8. The fault detection method for elevator power equipment according to claim 7, wherein the report information is transmitted to a local management system of the elevator, a cloud server and/or a user terminal, comprising a user's mobile communication terminal.

9. The fault detection method for elevator power equipment according to claim 1, wherein the actuator comprises a motor, and the characteristic frequencies comprise a natural frequency of a bearing rolling element, a fault characteristic frequency of the bearing rolling element, a fault characteristic frequency of a bearing outer ring and a fault characteristic frequency of a bearing inner ring on a stator side in the motor, a natural frequency of a bearing rolling element, a fault characteristic frequency of the bearing rolling element, a fault characteristic frequency of a bearing outer ring and a fault characteristic frequency of a bearing inner ring on a brake side of the elevator, a natural mechanical rotation frequency of the motor, an electrical frequency, a motor pole frequency and a motor stator slot frequency.

10. A fault detection device for elevator power equipment, wherein the fault detection device for elevator power equipment comprises a processor configured to perform steps of:

acquiring running speed data of an actuator in the elevator power equipment, and using corresponding running speed data in response to an elevator is at a first speed and within a preset duration as target data;

obtaining time-domain signal data of acceleration by calculation according to the target data;

obtaining frequency-domain signal data of acceleration by conversion according to the time-domain signal data; and comparing peak frequencies that form waveform peaks in the frequency-domain signal data with characteristic frequencies of the elevator power equipment, and determining the elevator power equipment to be faulty in response to at least one first frequency is detected in the peak frequencies, wherein the at least one first frequency matches one of the characteristic frequencies and an amplitude thereof exceeds a preset threshold.

11. The fault detection device for elevator power equipment according to claim 10, wherein the processor is further configured to perform steps of:

acquiring corresponding running speed data of the actuator in response to the elevator is at a second speed and within the preset duration as target data in response to the at least one first frequency is detected in the peak frequencies, wherein the second speed is different from the first speed;

obtaining time-domain signal data of acceleration by calculation according to the target data acquired;

obtaining frequency-domain signal data of acceleration by conversion according to the time-domain signal data obtained; and comparing peak frequencies that form waveform peaks in the frequency-domain signal data obtained with the at least one first frequency, and determining the elevator power equipment to be faulty in response to a second frequency is detected in the peak frequencies, wherein the frequencies of the second frequency and the at least one first frequency are the same, and a ratio between amplitudes of the second frequency and the at least one first frequency is equal to a ratio of the second speed to the first speed.

12. The fault detection device for elevator power equipment according to claim 11, wherein the second speed is lower than the first speed, and/or the range of the preset duration is 1 to 60 seconds.

13. The fault detection device for elevator power equipment according to claim 10, wherein the processor is arranged in an encoder associated with the actuator, or is arranged in a device connected with the encoder and/or the elevator controller and obtaining the running speed data of the actuator and/or the running speed data of the elevator from the encoder and/or the elevator controller.

14. The fault detection device for elevator power equipment according to claim 13, wherein a sampling frequency of the encoder is set to be at least twice a characteristic frequency, and a recording duration of the encoder is set to be at least twice the reciprocal of the characteristic frequency.

15. The fault detection device for elevator power equipment according to claim 10, wherein the processor is configured to: perform differential calculation according to the target data to obtain the time-domain signal data, and/or to perform Fast Fourier Transform according to the time-domain signal data to obtain the frequency-domain signal data.

16. The fault detection device for elevator power equipment according to claim 10, wherein the processor is further configured to: output report information and/or control the elevator to stop running after it is determined that the elevator power equipment is faulty.

17. The fault detection device for elevator power equipment according to claim 16, wherein the report information is transmitted to a local management system of the elevator, a cloud server and/or a user terminal, comprising a user's mobile communication terminal.

18. The fault detection device for elevator power equipment according to claim 10, wherein the actuator comprises a motor, and the characteristic frequencies comprise a natural frequency of a bearing rolling element, a fault characteristic frequency of the bearing rolling element, a fault characteristic frequency of a bearing outer ring and a fault characteristic frequency of a bearing inner ring on a stator side in the motor, a natural frequency of a bearing rolling element, a fault characteristic frequency of the bearing rolling element, a fault characteristic frequency of a bearing outer ring and a fault characteristic frequency of a bearing inner ring on a brake side of the elevator, a natural mechanical rotation frequency of the motor, an electrical frequency, a motor pole frequency and a motor stator slot frequency.

19. An elevator system, wherein the elevator system is configured with the fault detection device for elevator power equipment according to claim 10.

* * * * *